(12) United States Patent
Shen et al.

(10) Patent No.: US 10,950,652 B2
(45) Date of Patent: *Mar. 16, 2021

(54) LIGHT-EMITTING STRUCTURE HAVING A PLURALITY OF LIGHT-EMITTING STRUCTURE UNITS

(71) Applicant: EPISTAR CORPORATION, Hsinchu (TW)

(72) Inventors: Chien-Fu Shen, Hsinchu (TW); Chao-Hsing Chen, Hsinchu (TW); Tsun-Kai Ko, Hsinchu (TW); Schang-Jing Hon, Hsinchu (TW); Sheng-Jie Hsu, Hsinchu (TW); De-Shan Kuo, Hsinchu (TW); Hsin-Ying Wang, Hsinchu (TW); Chiu-Lin Yao, Hsinchu (TW); Chien-Fu Huang, Hsinchu (TW); Hsin-Mao Liu, Hsinchu (TW); Chien-Kai Chung, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/037,862

(22) Filed: Jul. 17, 2018

(65) Prior Publication Data
US 2019/0035846 A1 Jan. 31, 2019

Related U.S. Application Data

(63) Continuation of application No. 15/196,717, filed on Jun. 29, 2016, now Pat. No. 10,062,730, which is a
(Continued)

(51) Int. Cl.
*H01L 27/15* (2006.01)
*H01L 25/075* (2006.01)
(Continued)

(52) U.S. Cl.
CPC ........ *H01L 27/156* (2013.01); *H01L 25/0753* (2013.01); *H01L 27/153* (2013.01);
(Continued)

(58) Field of Classification Search
CPC .......... H01L 33/00; H01L 33/20; H01L 33/62
See application file for complete search history.

(56) References Cited

U.S. PATENT DOCUMENTS 5,075,253 A  12/1991  Sliwa, Jr.
6,784,105 B1  8/2004  Yang et al.
(Continued)

FOREIGN PATENT DOCUMENTS

CN  101276871 A  10/2008
CN  101388427 A  3/2009
(Continued)

*Primary Examiner* — Daniel Whalen
*Assistant Examiner* — Suberr L Chi
(74) *Attorney, Agent, or Firm* — Ditthavong & Steiner P.C.

(57) ABSTRACT

Disclosed herein is a light-emitting device. The light-emitting device includes a substrate with a top surface; a first light-emitting structure unit and a second structure light-emitting unit disposed on the top surface, the first light-emitting structure unit and the second light-emitting structure unit being spaced apart from each other, wherein each of the first light-emitting structure unit and the second light-emitting structure unit includes a lower layer having a first conductivity and an upper layer having a second conductivity; a trench between the first light-emitting structure unit and the second light-emitting structure unit, including a bottom portion which is a part of the top surface; an isolation layer, disposed on the trench and covering the bottom portion; and an electrical connection, electrically connecting the first light-emitting structure unit and the second light-emitting structure unit; wherein the lower layer includes an
(Continued)

inclined sidewall and the electrical connection contacts the inclined sidewall.

18 Claims, 7 Drawing Sheets

Related U.S. Application Data continuation of application No. 14/924,264, filed on Oct. 27, 2015, now Pat. No. 9,406,719, which is a continuation of application No. 13/230,988, filed on Sep. 13, 2011, now Pat. No. 9,196,605.

(60) Provisional application No. 61/382,451, filed on Sep. 13, 2010.

(51) Int. Cl.
    *H01L 33/20*     (2010.01)
    *H01L 33/62*     (2010.01)
    *H01L 33/38*     (2010.01)
    *H01L 33/44*     (2010.01)

(52) U.S. Cl.
    CPC ............ *H01L 33/20* (2013.01); *H01L 33/382* (2013.01); *H01L 33/44* (2013.01); *H01L 33/62* (2013.01); *H01L 33/385* (2013.01); *H01L 2924/0002* (2013.01)

(56) References Cited

U.S. PATENT DOCUMENTS

| | | | |
|---|---|---|---|
| 7,923,738 B2 | 4/2011 | Murofushi et al. | |
| 7,998,761 B2 | 8/2011 | Kim et al. | |
| 8,030,669 B2 | 10/2011 | Shakuda et al. | |
| 8,383,433 B2 | 2/2013 | Lee et al. | |
| 9,093,627 B2 | 7/2015 | Lee et al. | |
| 2005/0186712 A1 | 8/2005 | Smith | |
| 2005/0281303 A1* | 12/2005 | Horio | H01L 33/08 372/44.01 |
| 2006/0108593 A1* | 5/2006 | Kim | H01L 33/46 257/94 |
| 2006/0157717 A1 | 7/2006 | Nagai et al. | |
| 2007/0152226 A1 | 7/2007 | Salam | |
| 2007/0262331 A1 | 11/2007 | Ogihara et al. | |
| 2010/0059768 A1 | 3/2010 | Hasnain | |
| 2010/0163900 A1 | 7/2010 | Seo et al. | |
| 2010/0210046 A1* | 8/2010 | Kao | H01L 33/52 438/26 |
| 2010/0213474 A1 | 8/2010 | Hsu et al. | |
| 2011/0062891 A1 | 3/2011 | Chen et al. | |

FOREIGN PATENT DOCUMENTS

| | | |
|---|---|---|
| CN | 101431092 A | 5/2009 |
| CN | 101685842 A | 3/2010 |
| CN | 101783378 A2 | 7/2010 |
| CN | 101820043 A | 9/2010 |
| JP | 0846279 H | 2/1996 |
| JP | 2002359402 A | 12/2002 |
| JP | 3654745 B2 | 6/2005 |
| JP | 2006080441 A | 3/2006 |
| JP | 2010118624 A | 5/2010 |
| KR | 10-0679449 B1 | 2/2007 |
| KR | 10-0690323 B1 | 2/2007 |
| KR | 1020080002161 A | 1/2008 |
| KR | 1020100097028 A | 9/2010 |
| TW | 201031036 A | 8/2010 |
| TW | 201031036 A1 | 8/2010 |
| TW | 201031977 A | 9/2010 |
| TW | 201031977 A1 | 9/2010 |

\* cited by examiner

LIGHT-EMITTING STRUCTURE HAVING A PLURALITY OF LIGHT-EMITTING STRUCTURE UNITS

CROSS-REFERENCE TO RELATED APPLICATIONS

This application is a continuation application of U.S. patent application Ser. No. 15/196,717, filed on Jun. 29, 2016, which is a continuation of U.S. patent application Ser. No. 14/924,264, filed on Oct. 27, 2015 (now U.S. Pat. No. 9,406,719), which is a continuation of U.S. patent application Ser. No. 13/230,988, filed on Sep. 13, 2011 (now U.S. Pat. No. 9,196,605), which claims the right of priority based on U.S. provisional application Ser. No. 61/382,451, filed on Sep. 13, 2010, and the content of which is hereby incorporated by reference in its entirety.

TECHNICAL FIELD

The present application relates to a light-emitting structure, and more particularly to a light-emitting structure having at least two light-emitting units and an electrical connection for connecting the light-emitting units.

DESCRIPTION OF BACKGROUND ART

A light-emitting diode array is constructed by electrically connecting several light-emitting diodes in series or parallel. One diode is electrically separated from another by a trench or groove. To connect the separated diodes, metal line(s) or film(s) can be used to span the trench between the diodes. However, the metal line(s) or film(s) can be easily damaged during the manufacturing process due to a high aspect ratio of the trench.

SUMMARY OF THE DISCLOSURE

An embodiment of the present application discloses a light-emitting device, including a substrate with a top surface; a first light-emitting structure unit and a second structure light-emitting unit disposed on the top surface, the first light-emitting structure unit and the second light-emitting structure unit being spaced apart from each other, wherein each of the first light-emitting structure unit and the second light-emitting structure unit includes a lower layer having a first conductivity and an upper layer having a second conductivity; a trench between the first light-emitting structure unit and the second light-emitting structure unit, including a bottom portion which is a part of the top surface; an isolation layer, disposed on the trench and covering the bottom portion; and an electrical connection, electrically connecting the first light-emitting structure unit and the second light-emitting structure unit; wherein the lower layer includes an inclined sidewall and the electrical connection contacts the inclined sidewall.

Another embodiment of the present application discloses a light-emitting device, including a substrate with a top surface; a first light-emitting structure unit and a second light-emitting structure unit disposed on the top surface, the first light-emitting structure unit and the second light-emitting structure unit being spaced apart from each other and electrically connecting with each other; a trench between the first light-emitting structure unit and the second light-emitting structure unit, including a bottom portion which is a part of the top surface; wherein the first light-emitting structure unit includes an undercut sidewall and an included angle between the undercut sidewall and the top surface is greater than 90 degrees.

DESCRIPTIONS OF EMBODIMENTS

Figure 1:
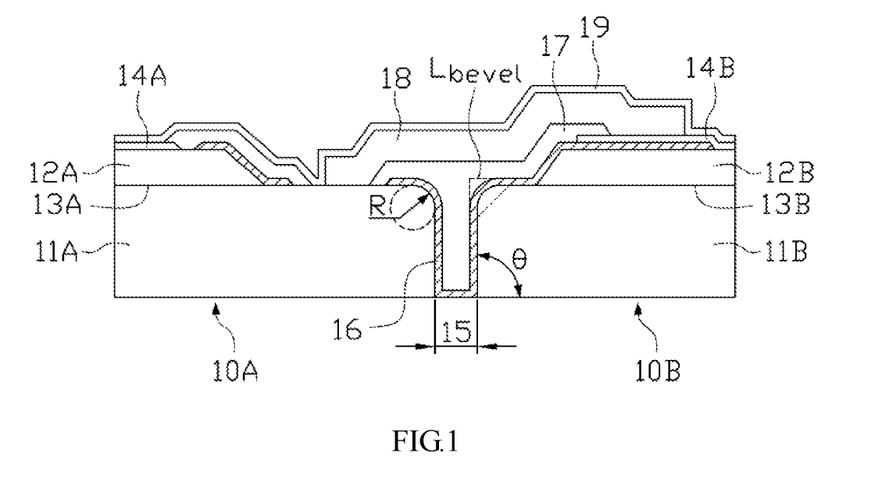
FIG. 1 illustrates a cross-sectional view disclosing a connection between two light-emitting structure units in accordance with an embodiment of the present invention.

FIG. 1 illustrates a cross-sectional view disclosing a connection between two light-emitting structure units in accordance with an embodiment of the present invention. Each of the left light-emitting structure unit 10A and the right light-emitting structure unit 10B includes a lower layer (11A, 11B), an upper layer (12A, 12B), a light-emitting junction (13A, 13B) between the lower layer (11A, 11B) and the upper layer (12A, 12B), and a current spreading layer (14A, 14B), which are sequentially formed on a substrate (not shown) by epitaxial growth or bonding method such as metal boding, fusion bonding, and glue bonding.

The left light-emitting structure unit 10A and the right light-emitting structure unit 10B can be supported by a common substrate or discrete substrates, and electrically separated by a trench 15. For example, the light-emitting structure units 10A and 10B can be commonly formed on a single bulk substrate, such as sapphire, GaAs, Si, metal, glass, or PCB; or each light-emitting structure unit is formed on its independent bulk substrate as described aforementioned, while each independent bulk substrate can be further integrated together by mechanical gadgets, organic material, metallic material, or any combination thereof. The trench 15 is formed to reach to, enter in, or penetrate the substrate or any layer between the units. The trench 15 has a cross-sectional profile of at least one rounded edge and/or at least one chamfered edge. The rounded edge and/or the chamfered edge can be formed on a single layer or several layers. For example, as shown in the drawing, the rounded edge and/or the chamfered edge can be formed on the lower layer 11A and/or the lower layer 11B. However, the rounded edge and/or the chamfered edge can be also formed on both of the upper layer and the lower layer. The rounded edge preferably has a radius R not less than 1 µm. The chamfered edge can have two equal or different bevel lengths ($L_{bevel}$).

Moreover, a sidewall of the trench is inclined by more than 80 degree against the bottom surface of the lower layer. For example, the angle θ between the sidewall and the bottom surface of the lower layer, as illustrated in the drawing, is smaller than 80 degree, 70 degree, 60 degree, 50 degree, or 40 degree. The angle θ can also fall within a specific range, such as 80 degree~70 degree, 70 degree~60 degree, and 60 degree~40 degree. Besides, the trench may have sidewalls inclined at similar or different angles. For example, one sidewall is inclined at an angle of 50 degree~40 degrees; the other sidewall is inclined at an angle of 60 degree~50 degree. Provided one or more sidewalls are inclined, the trench can have a trapezoid cross section having a height, a longer side, and a shorter side parallel to the longer side. The height is close to the thickness of the lower layer or the total thickness of the upper layer and the lower layer. For example, the height is between 1 µm~10 µm; the longer side has a length of 3 µm~100 µm; the shorter side has a length of 1 µm~40 µm; the ratio of the longer side to the short side is between 3:1 and 1.5:1. Specifically, the height is between 4 µm~9 µm; the length of the longer side is between 5 µm~40 µm; the length of the shorter side is between 2.5 µm~20 µm.

To build an electrical passage between the units, an electrical connection 18 bridges the trench 15 and electrically connects any two layers, which do not belong to the same unit, of the lower layer 11A, lower layer 11B, upper layer 12A, and upper layer 12B. For example, the units can be coupled together in series connection by bridging the lower layer 11A and the upper layer 12B, or the upper layer 12A and the lower layer 11B; the units can be coupled in parallel connection by bridging the upper layer 12A and upper layer 12B.

To prevent the electrical connection 18 from unintentionally contacting with other layer, an isolation layer 16 can be also provided on the trench 15 and some areas near the trench opening, such as the sidewall(s) of the lower layer 11A and/or the lower layer 11B, the edge(s) of the trench 15, the sidewall(s) of the upper layer 12A and/or the upper layer 12B, the top surface(s) of the upper layer 12A and/or the upper layer 12B, and/or the bottom surface(s) of the current spreading layer 14A and/or the current spreading layer 14B. Optionally, an isolation layer 17 can be further provided between the isolation layer 16 and the electrical connection 18. The isolation layer 17 can be used to fill the empty space between the isolation layer 16 and the electrical connection 18, to fill voids on the isolation layer 16, to smooth the outer surface of the isolation layer 16, to fill the trench 15, to form a flat plane for laying the electrical connection 18, to cover area(s) not under the shade of the isolation layer 16, to improve ESD protection, and/or to support the electrical connection 18.

The isolation layer 16 can have an edge with an acute angle; the layer laid on the isolation layer 16 therefore can smoothly cover the drop on the edge of the isolation layer 16. The slope of the edge can release the stress concentrated on the layer over the drop. The acute angle can be less than 90, 80, 70, 60, or 50 degree. Besides the isolation layer 16, the isolation layer 17 can also have an edge with an acute angle.

In addition, to protect the electrical connection 18 from oxidation, erosion, and/or damage, a passivation 19 can be formed on the electrical connection 18. The passivation 19 can cover not only outer surface(s) of the electrical connection 18 but also the area beyond the outer surface(s). Specifically, the passivation 19 can be further formed on any surfaces of the isolation layer 17, the current spreading layer 14A, the current spreading layer 14B, the upper layer 12A, the upper layer 12B, the lower layer 11A, and/or the lower layer 11B.

Figure 2:
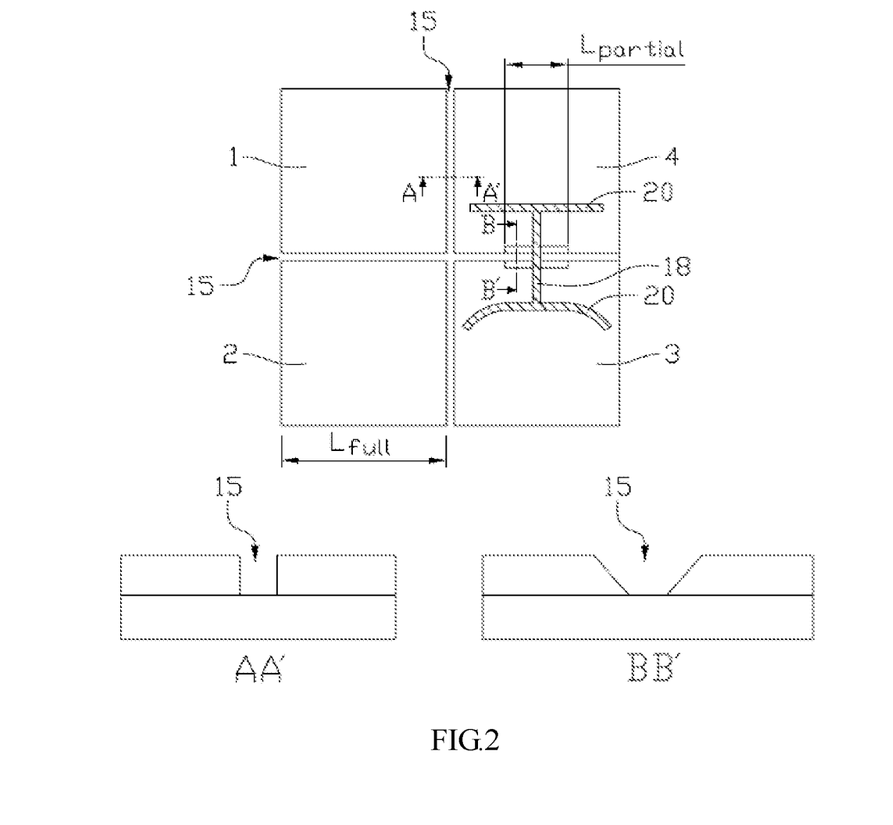
FIG. 2 illustrates a top view of light-emitting structure units in accordance with an embodiment of the present invention.

FIG. 2 illustrates a top view of light-emitting structure units in accordance with an embodiment of the present invention. In the drawing, four rectangular light-emitting structure units 1, 2, 3, 4 are deployed in a 2×2 array; however, the shape, the number, and the deployment of the light-emitting structure units are only illustrative but not to limit applications and variations of the present invention.

The light-emitting structure units 1, 2, 3, 4 are laterally separated by trenches 15. An electrical connection 18 can bridge the trench 15 from one light-emitting structure unit (for example, unit 3) to another light-emitting structure unit (for example, unit 4) and couple the two units in series or parallel connection. As shown in cross section AA', the trench 15 (for example, between units 1 and 4) on which no electrical connection 18 is formed has steeper sidewalls, therefore, more volume of the light-emitting structure unit resides nearby the trench 15. In contrast, as shown in cross section BB', the trench 15 (for example, between units 3 and 4) on which the electrical connection 18 is formed has less steep sidewalls in comparison with the sidewalls in the cross section AA'. In one embodiment, some of the light-emitting structure units are removed to form a trench having a ladder-shaped, and/or inclined sidewall. In other words, the trench has a reversed-trapezoid or quasi-reversed-trapezoid cross-sectional profile. For example, the method for forming the trench can be selected from wet etching, dry etching, laser machining, diamond scribing, and any combination thereof. In general, the steeper the sidewall is, the shorter the processing time is taken.

In addition, the less steep sidewall can be formed on either a full length trench $L_{full}$ or a partial length trench $L_{partial}$ (as illustrated in FIG. 2). The full length trench $L_{full}$ herein is defined as a trench having a length similar to the width of the light-emitting structure unit; the partial length trench $L_{partial}$ is defined as a trench has a length smaller than the width of the light-emitting structure unit. For example, $L_{partial}$ is between 10 µm~100 µm; the width of the light-emitting structure unit is between 100 µm~1000 µm; the ratio of $L_{partial}$ to width of the light-emitting structure unit is between 1:2-1:10. Moreover, the electrical connection 18 can be further connected with a current network 20 through which current can come from or flow to a position far away from the electrical connection 18, as shown in FIG. 5.

Figure 3:
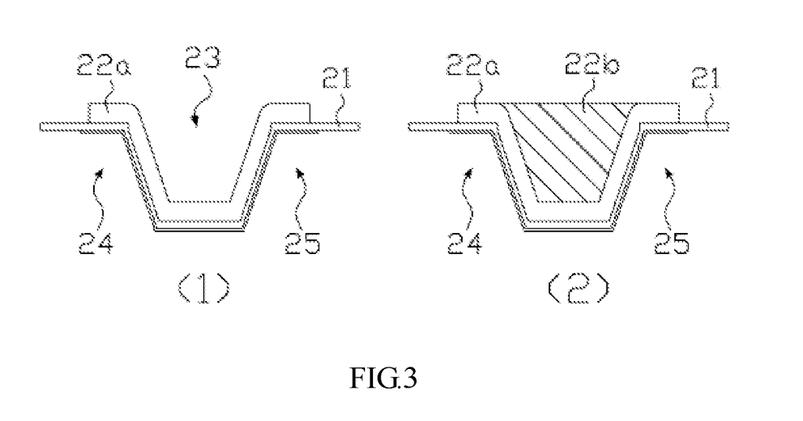
FIG. 3 illustrates a filling of the trench in accordance with an embodiment of the present invention.

FIG. 3 illustrates a filling of the trench. In step (1), an isolation layer 21 and a lower electrical connection 22a are sequentially provided on a trench 23 which is formed between two light-emitting structure units 24, 25. The isolation layer 21 can separate the lower electrical connection 22a from contacting with the light-emitting structure units 24, 25. The lower electrical connection 22a can electrically link two light-emitting structure units 24, 25. The lower electrical connection 22a can be formed by deposition and etching processes. Because the trench 23 has a tapered cross section, the inclined portion of the lower electrical connection 22a therefore usually is thinner than the flat portions thereof, and can be easily damaged during following processes. To reinforce the inclined portion of the lower electrical connection 22a, an upper electrical connection 22b is further provided on the lower electrical connection 22a. The upper electrical connection 22b is preferably provided on the top of the inclined portion or within the trench 23, as shown in step (2).

Figure 4:
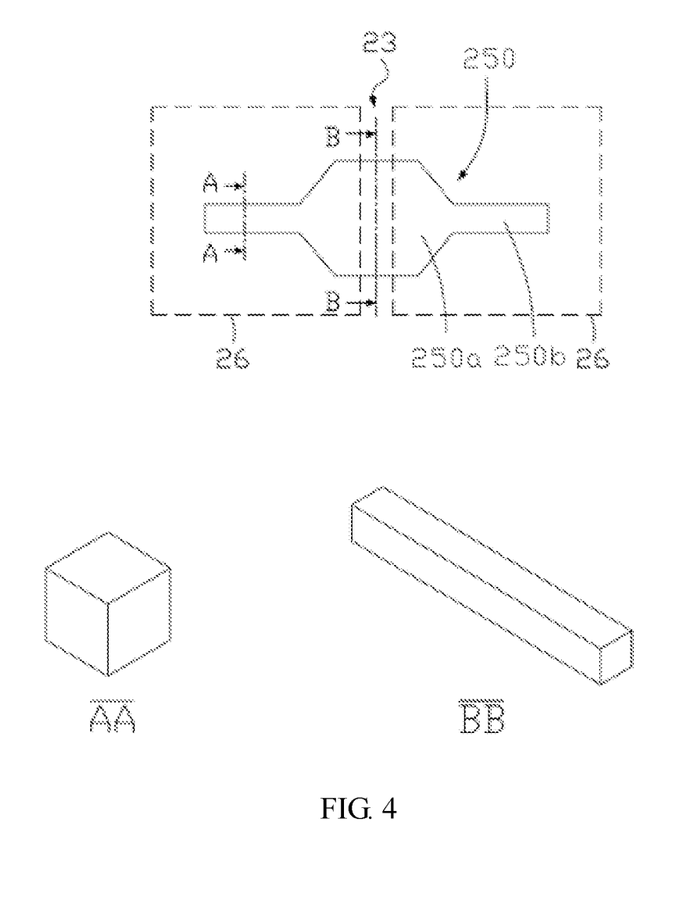
FIG. 4 illustrates a top view of an electrical connection over a trench in accordance with an embodiment of the present invention.

FIG. 4 illustrates a top view of an electrical connection over a trench between two light-emitting structure units in accordance with one embodiment of the present invention. The electrical connection 250 has a bridging portion 250a over the trench 23 and two joining portions 250b. Each of the two joining portions 250b is electrically connected to an anode or a cathode on each of the two light-emitting structure units 26. The bridging portion 250a has a BB cross section; the joining portion 250b has an AA cross section. The BB cross section has a width greater than that of the AA cross section, while the two cross sections can have equal or close area for achieving a constant or even electrical current per cross sectional area. For example, the bridging portion 250a has a width of 5 μm~50 μm; the joining portion 250b has a width of 3 μm~15 μm while both of them has a thickness close to 8 μm. However, the two cross sections can also have different area according to user's requirements or practical manufacturing processes. The bridging portion 250a can be constructed after the basic electrical connection manufacturing process is completed. For example, the electrical connection 250 over the trench 23 which has inclined sidewalls is firstly formed by depositing metal on specific areas of the trench 23 and the light-emitting structure units 26. But the deposited metal on the inclined sidewalls of the trench 23 is usually thinner than the deposited metal on the light-emitting structure unit 26, and the deposited metal bridging the two light-emitting structure units therefore has various cross sectional area. To increase the volume or the cross sectional area of the metal over the trench 23, an extra-deposition process is further applied on the thinner deposited metal area to form the bridging portion 250a as described above. Furthermore, the volume or the cross sectional area of the electrical connection 250 over the trench 23 can be increased by other methods, such as bonding one or more supplement articles on the thinner electrical connection portions, and depositing other material(s). The supplement article is such as metal and ceramic. Moreover, the thicker electrical connection portions can be even thinned down to the level similar to the portions over the trench 23.

Figure 5:
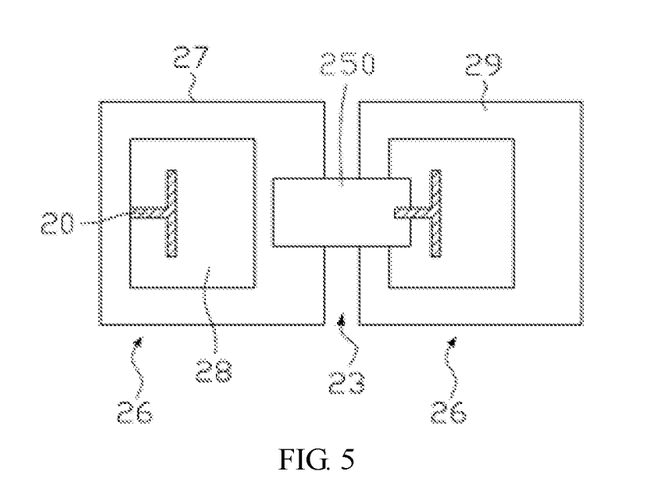
FIG. 5 illustrates a top view of an electrical connection over a trench between two light-emitting structure units in accordance with another embodiment of the present invention.

FIG. 5 illustrates a top view of an electrical connection 250 over a trench 23 between two light-emitting structure units in accordance with another embodiment of the present invention. Each of the light-emitting structure unit 26 includes a lower layer 27 and an upper layer 28 having a smaller area than that of the lower layer 27. The lower layer 27 has a mesa area 29 surrounding the upper layer 28. The light-emitting structure unit 26 can emit light from a light-emitting layer which is positioned within the upper layer 28 or between the upper layer 28 and the lower layer 27. Provided the light-emitting layer is positioned within the upper layer 28, the upper layer 28 can include a p-type semiconductor layer and an n-type semiconductor layer, between which the light-emitting layer is sandwiched; and the lower layer 27 can include a carrier for supporting the upper layer 28. The upper layer 28 can be epitaxially grown on the lower layer 27, or be integrated with the lower layer 27 by glue bonding, metal bonding, fusion bonding, or eutectic bonding. Provided the light-emitting layer is positioned between the upper layer 28 and the lower layer 27, either the upper layer 28 or the lower layer 27 can include a p-type semiconductor layer, and the other can include an n-type semiconductor layer.

To build a current passage from one light-emitting structure unit to another, an electrical connection 250 is provided on the two light-emitting structure units 26. As shown in the drawing, one end of the electrical connection 250 is installed on the upper layer 28, and the other end is installed on the lower layer 27. However, the two ends of the electrical connection 250 can be also installed on two upper layers 28 or two lower layers 27. The electrical connection 250 can be constructed by metal, semiconductor, metal oxide, or any combination thereof. Provided a metal oxide, which has higher transparency than that of metal, is used to form the electrical connection 250, fewer light escaping areas are therefore shaded by the electrical connection 250. The metal oxide is such as ITO, IZO, and CTO.

Figure 6:
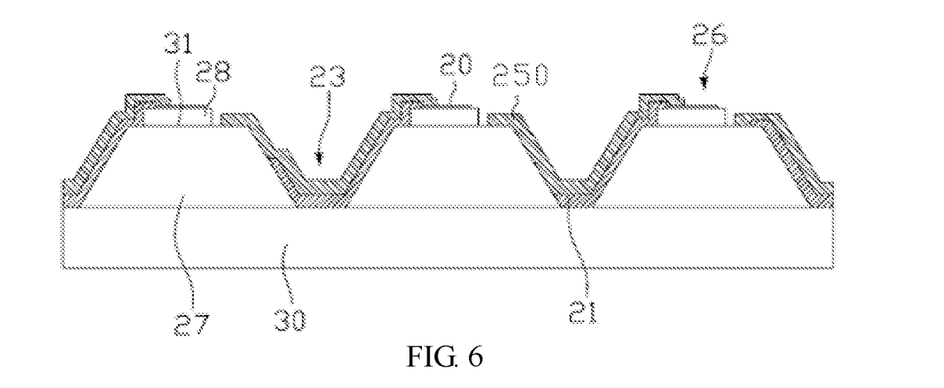
FIG. 6 illustrates a cross-sectional view of interconnections between light-emitting structure units in accordance with one embodiment of the present invention.

FIG. 6 illustrates a cross-sectional view of interconnections between light-emitting structure units in accordance with one embodiment of the present invention. Each light-emitting structure unit 26 includes an upper layer 28 and a lower layer 27 formed on a common substrate 30 by epitaxial growth and/or bonding method. The bonding method includes but not limited to metal bonding, eutectic bonding, glue bonding, and fusion bonding. A light-emitting zone 31 is sandwiched by the upper layer 28 and the lower layer 27. The light-emitting zone 31 can generate light when a bias voltage is imposed on the upper layer 28 and the lower layer 27. The light from the light-emitting zone 31 radiates isotropically.

Two light-emitting structure units 26 are separated by a trench 23. Provided the two light-emitting structure units 26 are coupled in series connection, an isolation layer 21 is formed on the trench 23 to leave the electrical connection 250 touching the upper layer 28 of one light-emitting structure unit 26 and the lower layer 27 of another light-emitting structure unit 26. In this embodiment, the isolation layer 21 is formed to expose not only the top surface but a portion of the sidewall of the lower layer 27. The exposure of the sidewall of the lower layer 27 can increase the contact area between the electrical connection 250 and the lower layer 27, and accordingly the current density can decrease.

Figure 7:
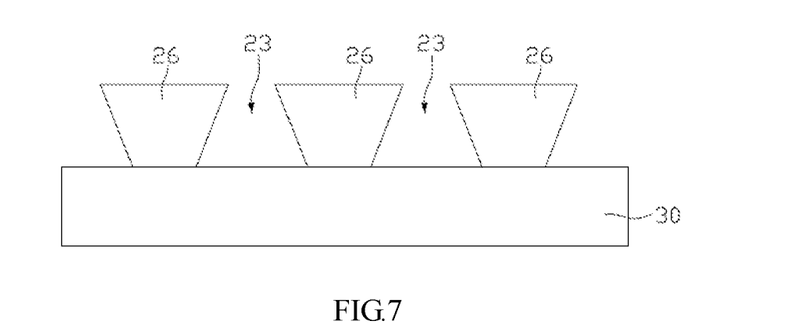
FIG. 7 illustrates a cross sectional view of several light-emitting structure units in accordance with an embodiment of the present invention.

FIG. 7 illustrates a cross sectional view of several light-emitting structure units in accordance with an embodiment of the present invention. The several light-emitting structure units 26 are supported by a substrate 30. Two neighboring light-emitting structure units 26 are separated by a trench 23. In the present embodiment, the trench 23 is trapezoid-shaped and has a narrower top opening and a wider bottom. The light-emitting structure unit 26 nearby the trench 23 therefore has an undercut sidewall with a degree greater than 90 degree, as shown in the drawing. In other words, the light-emitting structure unit 26 has a reversed trapezoid shape. Provided the light-emitting structure unit 26 can emit light from the middle part, the central part, or the upper part of the reversed trapezoid, the light moving backwards can leave the unit 26 on the benefit of the undercut sidewalls. The trapezoid-shaped trench can be formed by using over etching process.

In accordance with one embodiment of the present invention, the light-emitting structure unit can include at least a first conductivity layer (for example, the upper layer), a conversion unit (for example, the light-emitting zone), and a second conductivity layer (for example, the lower layer). Each of the first conductivity layer and the second conductivity layer has a single layer or a group of multiple layers ("multiple layers" means two or more layers), and the two single layers or the two groups of the multiple layers, which are respectively located on the first and the second conductivity layers, have distinct polarities or distinct dopants. For example, the first conductivity layer is a p-type semiconductor layer; the second conductivity layer is an n-type semiconductor layer. The conversion unit disposed between the first conductivity layer and the second conductivity layer is a region where the light energy and the electrical energy could be transferred or induced to transfer. The one that the electrical energy can be transferred to the light energy is such as a light-emitting diode, a liquid crystal display, and an organic light-emitting diode. The one that the light energy can be transferred to the electrical energy is such as a solar cell, and an optoelectronic diode.

The transferred light emission spectrum of the light-emitting diode can be controlled by changing the physical or chemical arrangement of one layer or more layers in the light-emitting diode. The light-emitting diode can be composed of several materials, such as the series of aluminum gallium indium phosphide (AlGaInP), the series of aluminum gallium indium nitride (AlGaInN), and/or the series of zinc oxide (ZnO). The conversion unit can be configured to be a single heterostructure (SH), a double heterostructure (DH), a double-side double heterostructure (DDH), or a multi-quantum well (MWQ). Besides, the wavelength of the emitting light could be controlled by changing the number of the pairs of the quantum well.

The material of the substrate(s) used for growing or supporting the light-emitting structure unit(s) can include but not limits to germanium (Ge), gallium arsenide (GaAs), indium phosphide (InP), sapphire, silicon carbide (SiC), silicon (Si), lithium aluminium oxide (LiAlO2), zinc oxide (ZnO), gallium nitride (GaN), aluminum nitride (AlN), glass, composite, diamond, CVD diamond, diamond-like carbon (DLC) and any combination thereof.

FIGS. 8A through 8F illustrate a method of forming light-emitting structure unit(s), or more specific to light emitting diode structures, in accordance with another embodiment of the present invention. Firstly, referring to FIG. 8A, a substrate 41 is provided. The material of the substrate 41 can be silicon, silicon carbide, sapphire, arsenide, phosphide, zinc oxide, and magnesium oxide. Then, a 1st semiconductor layer 42 which is an epitaxy layer of first conductivity, an active layer 43, and a 2nd semiconductor layer 44 which is an epitaxy layer of second conductivity are formed on the substrate 41. The material of the 1st semiconductor layer 42 and the 2nd semiconductor layer 44 include but not limited to an indium-containing nitride semiconductor, an aluminum-containing nitride semiconductor, and a gallium-containing nitride semiconductor. The material of the active layer 43 include but not limited to indium gallium nitride, indium gallium aluminum phosphide, aluminum gallium nitride, aluminum gallium arsenide, and indium gallium arsenide.

Figure 8A:
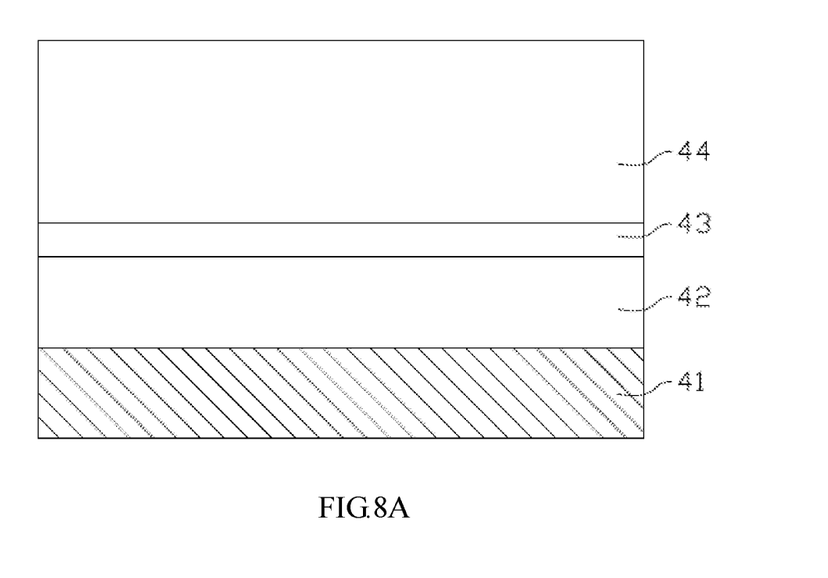
FIGS. 8A-8F illustrate steps of forming light-emitting structure unit in accordance with an embodiment of the present invention.
Figure 8B:
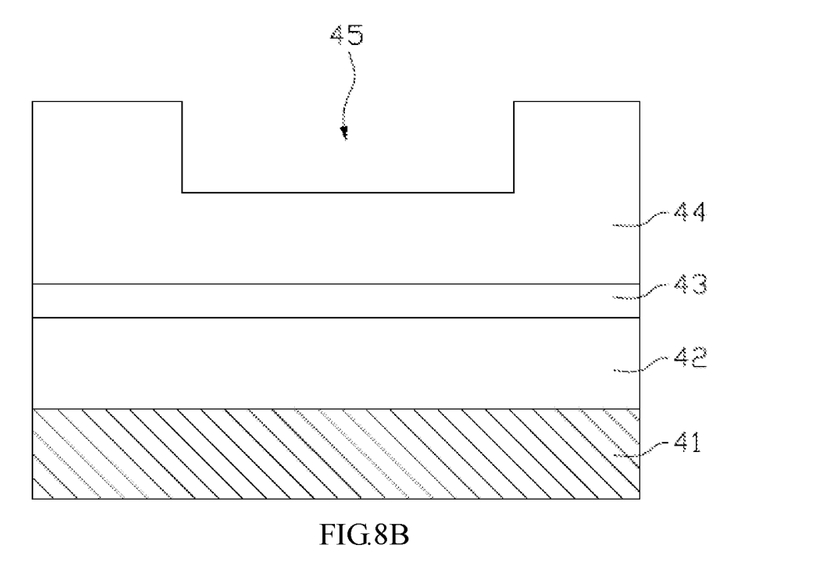
Figure 8C:
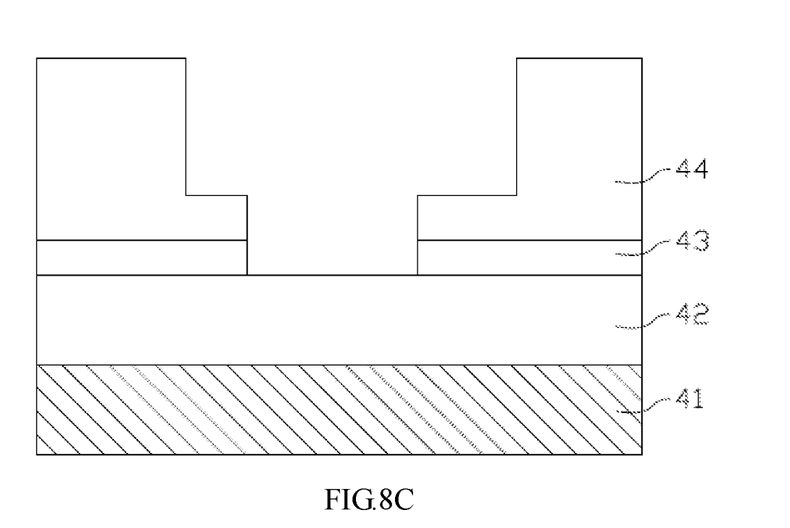
Figure 8D:
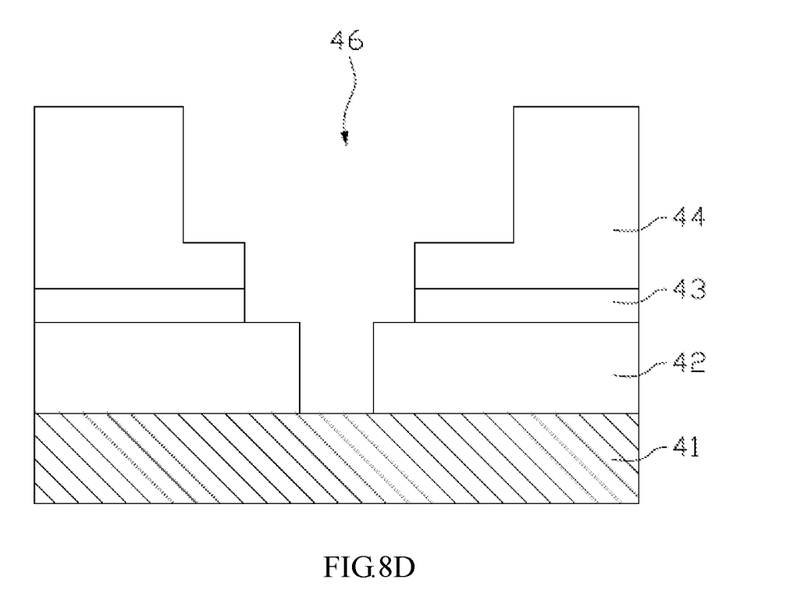

Referring to FIGS. 8B-8D, a multi-step patterning process is performed. Firstly, a first region of the 2nd semiconductor layer 44 is defined so that the 2nd semiconductor layer 44 has a concave portion 45 therein by photolithography and etching technology. Then, as shown in FIG. 8C, a second etching process is performed to etch away partial of the 2nd semiconductor layer 44 and partial of the active layer 43 until a surface of the 1st semiconductor layer 42 is exposed. Finally, as shown in FIG. 8D, a third pattern process is performed to divide the 1st semiconductor layer 42 by forming a trench 46 therebetween through the photolithography and etching technology. After the multi-step patterning process, light emitting diode structure are divided with the step-like sidewall profiles as shown in FIG. 8D.

Figure 8E:
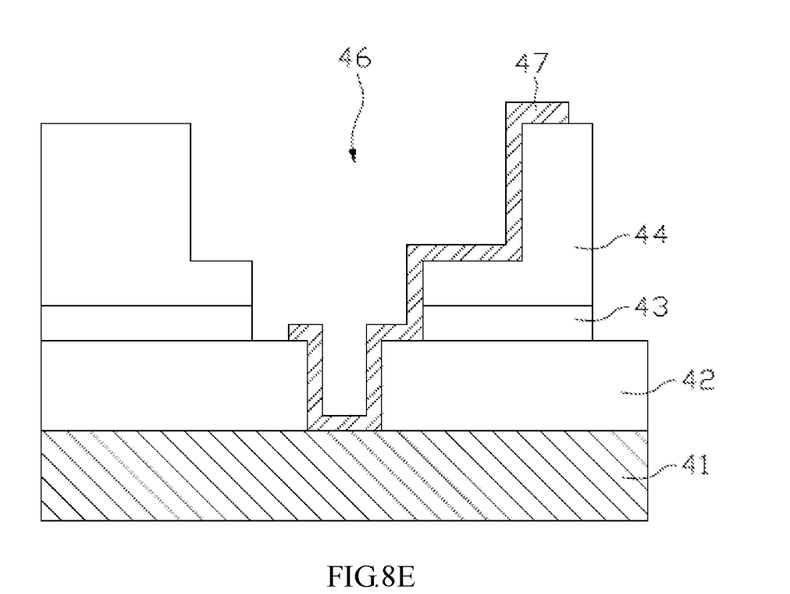
Figure 8F:
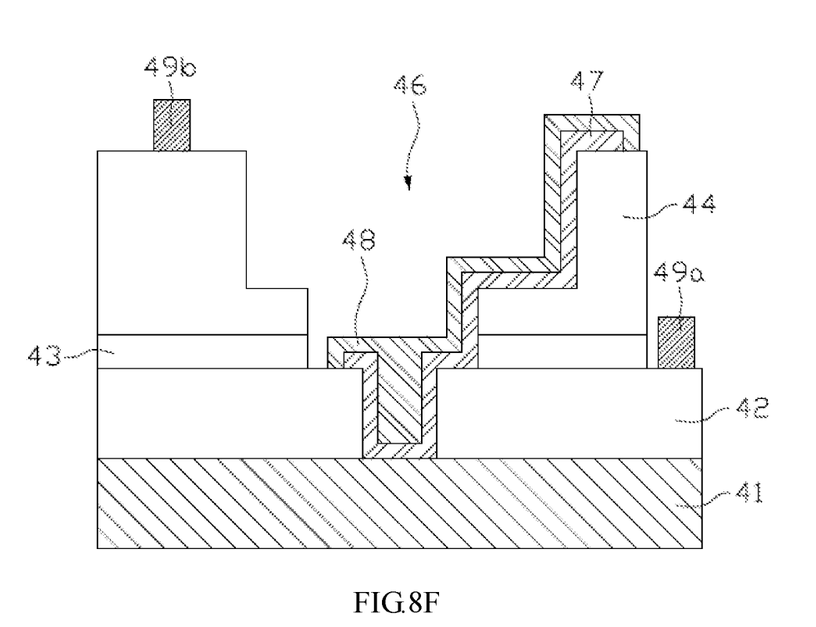

Referring to FIG. 8E, an insulating layer 47 is further formed between two divided light emitting diode structures 40 to cover the step-like sidewalls of the adjacent light emitting diode structures. Wherein, the insulating layer 47 is made of dielectric material such as silicon nitride, silicon oxide, aluminum oxide, and the combination thereof. Then, as shown in FIG. 8F, a conductive structure 48 is formed on the insulating layer 47 to electrically connect the 1st semiconductor layer 42 of the left light emitting diode structure and the 2nd semiconductor layer 43 of the right light emitting diode structure in series. In addition, a 1st electrode 49a and a 2nd electrode 49b can also be formed at the same step or in the different steps while the conductive structure 48 is formed.

In addition to the patterning process mentioned above, the step-like sidewalls could also be formed by using a gray-tone mask or by a half-tone mask. Taking advantage of different opening ratio existing on a single mask, the step-like sidewall profile can be formed through a one-step exposure.

Figure 9:
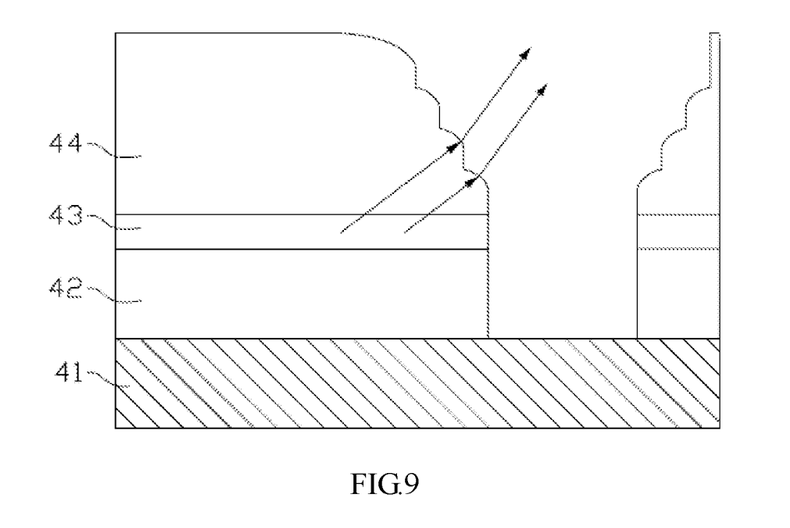
FIG. 9 illustrates a cross sectional view of a light-emitting structure unit in accordance with an embodiment of the present invention.

Referring to FIG. 9, through the step-like sidewall structure, light (as indicated by arrows) comes from different angles can be extracted more easily because the light can go out to the sidewall of the light emitting diodes from different angles, and therefore a better light extraction ability of the light emitting diode structure could be achieved. Besides, because the slope of the step-like sidewalls is gentle, the coverage profile of the insulating layer and the conductive structure on the light emitting diode can be more uniform.

What is claimed is:

1. A light emitting device, comprising:
   a substrate, comprising a top surface;
   a first light-emitting structure unit and a second light-emitting structure unit disposed on the top surface, the first light-emitting structure unit and the second light-emitting structure unit being spaced apart from each other, wherein each of the first light-emitting structure unit and the second light-emitting structure unit comprises a lower layer having a first conductivity and an upper layer having a second conductivity;
   a trench between the first light-emitting structure unit and the second light-emitting structure unit, comprising a bottom portion which is a part of the top surface;
   an isolation layer, disposed on the trench and directly contacting the bottom portion; and
   an electrical connection, disposed on the isolation layer and electrically connecting the first light-emitting structure unit and the second light-emitting structure unit;
   wherein:
   the lower layer comprises an inclined sidewall and the electrical connection physically contacts the inclined sidewall, and
   the isolation layer is between the bottom portion and the electrical connection.

2. The light emitting device of claim 1, wherein the isolation layer is disposed on the upper layer of the second light-emitting structure unit.

3. The light emitting device of claim 2, further comprising a current spreading layer disposed on the isolation layer on the upper layer of the second light-emitting structure unit.

4. The light emitting device of claim 2, wherein the isolation layer comprises a side surface and a bottom surface facing the second light-emitting unit, and wherein an included angle of the bottom surface and the side surface is an acute angle in a cross-sectional view.

5. The light emitting device of claim 1, wherein the electrical connection contacts a top surface of the lower layer of the first light-emitting structure unit.

6. The light emitting device of claim 1, wherein the upper layer and the lower layer are formed on the substrate by epitaxial growth.

7. The light emitting device of claim 1, wherein the electrical connection comprises a bridging structure and a joining structure, and the bridging structure has a width larger than that of the joining structure.

8. The light emitting device of claim 7, wherein the bridging structure has the width of 5 μm~50 μm.

9. The light emitting device of claim 7, wherein the joining structure has the width of 3 μm~15 μm.

10. The light emitting device of claim 7, wherein the electrical connection comprises a taper segment connecting the bridging structure and the joining structure.

11. The light emitting device of claim 1, wherein the trench has a cross-sectional profile of a rounded edge or a chamfered edge.

12. The light emitting device of claim 11, wherein the rounded edge or the chamfered edge is formed on the lower layer of the first light-emitting structure unit and/or is formed on the lower layer of the second light-emitting structure unit.

13. The light emitting device of claim 11, wherein the rounded edge has a radius not less than 1 μm.

14. The light emitting device of claim 1, wherein the inclined sidewall of the lower layer of the first light-emitting structure unit faces the second structure light-emitting unit, and the lower layer of the first light-emitting structure unit comprises another sidewall not facing the second structure light-emitting unit, wherein the another sidewall is steeper than the inclined sidewall.

15. A light emitting device, comprising:
a substrate, comprising a top surface;
a first light-emitting structure unit and a second light-emitting structure unit disposed on the top surface, the first light-emitting structure unit and the second light-emitting structure unit being spaced apart from each other, wherein each of the first light-emitting structure unit and the second light-emitting structure unit comprises a lower layer having a first conductivity and an upper layer having a second conductivity;
a trench between the first light-emitting structure unit and the second light-emitting structure unit, comprising a bottom portion which is a part of the top surface;
an isolation layer, disposed on the trench and covering the bottom portion; and
an electrical connection, electrically connecting the first light-emitting structure unit and the second light-emitting structure unit;
wherein the lower layer comprises an inclined sidewall and the electrical connection physically contacts the inclined sidewall, and
wherein the electrical connection comprises a bridging structure and a joining structure, and the bridging structure has a width larger than that of the joining structure.

16. The light emitting device of claim 15, wherein the isolation layer is disposed on the upper layer of the second light-emitting structure unit and the light emitting device further comprises a current spreading layer disposed on the isolation layer on the upper layer of the second light-emitting structure unit.

17. The light emitting device of claim 15, wherein the bridging structure is disposed on the isolation layer on the trench.

18. The light emitting device of claim 15, wherein the inclined sidewall of the lower layer of the first light-emitting structure unit faces the second structure light-emitting unit, and the lower layer of the first light-emitting structure unit comprises another sidewall not facing the second structure light-emitting unit, wherein the another sidewall is steeper than the inclined sidewall.

* * * * *